(12) United States Patent
Lu et al.

(10) Patent No.: US 7,695,563 B2
(45) Date of Patent: *Apr. 13, 2010

(54) PULSED DEPOSITION PROCESS FOR TUNGSTEN NUCLEATION

(75) Inventors: Xinliang Lu, Sunnyvale, CA (US); Ping Jian, San Jose, CA (US); Jong Hyun Yoo, Milpitas, CA (US); Ken Kaung Lai, Milpitas, CA (US); Alfred W. Mak, Union City, CA (US); Robert L. Jackson, San Jose, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 347 days.

This patent is subject to a terminal disclaimer.

(21) Appl. No.: 11/621,040

(22) Filed: Jan. 8, 2007

(65) Prior Publication Data

US 2008/0317954 A1 Dec. 25, 2008

Related U.S. Application Data

(63) Continuation of application No. 10/194,629, filed on Jul. 12, 2002, now Pat. No. 7,211,144, which is a continuation-in-part of application No. 10/023,125, filed on Dec. 17, 2001, now abandoned.

(60) Provisional application No. 60/305,307, filed on Jul. 13, 2001.

(51) Int. Cl.
*C30B 25/14* (2006.01)
(52) U.S. Cl. .............................. 117/89; 117/86; 117/90; 117/92
(58) Field of Classification Search ................... 117/86, 117/89, 90, 92
See application file for complete search history.

(56) References Cited

U.S. PATENT DOCUMENTS 3,785,862 A 1/1974 Grill (Continued)

FOREIGN PATENT DOCUMENTS

DE 196 27 017 1/1997

(Continued)

OTHER PUBLICATIONS

Buerke, et al. "PNL™ low Resistivity tungsten for contact fill," Conference Proceedings AMC XXI, 2006, Materials Research Society, pp. 221-226.

(Continued)

*Primary Examiner*—Robert M Kunemund
(74) *Attorney, Agent, or Firm*—Patterson & Sheridan, LLP (57) ABSTRACT

In one embodiment, a method for depositing a tungsten material on a substrate within a process chamber is provided which includes exposing the substrate to a gaseous mixture containing a tungsten precursor and a reducing gas to deposit a tungsten nucleation layer on the substrate during a tungsten deposition process. The process further includes removing reaction by-products generated during the tungsten deposition process from the process chamber, exposing the substrate to the reducing gas to react with residual tungsten precursor within the process chamber during a soak process, removing reaction by-products generated during the soak process from the process chamber, and repeating the tungsten deposition process and the soak process during a cyclic deposition process. In the examples, the reducing gas may contain diborane or silane.

30 Claims, 3 Drawing Sheets

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |
| 4,617,087 A | 10/1986 | Iyer et al. |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,307 A | 8/1989 | Nishizawa et al. |
| 4,859,627 A | 8/1989 | Sunakawa |
| 4,861,417 A | 8/1989 | Mochizuki et al. |
| 4,876,218 A | 10/1989 | Pessa et al. |
| 4,892,751 A | 1/1990 | Miyake et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,976,839 A | 12/1990 | Inoue et al. |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,037,775 A | 8/1991 | Reisman |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock |
| 5,225,366 A | 7/1993 | Yoder |
| 5,227,335 A | 7/1993 | Holschwandner et al. |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,391,394 A | 2/1995 | Hansen |
| 5,395,791 A | 3/1995 | Cheng et al. |
| 5,407,698 A | 4/1995 | Emesh |
| 5,438,952 A | 8/1995 | Otsuka |
| 5,439,876 A | 8/1995 | Graf et al. |
| 5,441,703 A | 8/1995 | Jurgensen |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,817,576 A | 10/1998 | Tseng et al. |
| 5,830,270 A | 11/1998 | McKee et al. |
| 5,834,372 A | 11/1998 | Lee |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,412 A | 3/1999 | Blaugher |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 5,989,345 A | 11/1999 | Hatano et al. |
| 5,994,775 A | 11/1999 | Zhao et al. |
| 6,001,669 A | 12/1999 | Gaines et al. |
| 6,015,590 A | 1/2000 | Suntola et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu |
| 6,086,677 A | 7/2000 | Umotoy et al. |

| | | | | | | |
|---|---|---|---|---|---|---|
| 6,099,904 | A | 8/2000 | Mak et al. | 6,620,723 B1 | 9/2003 | Byun et al. |
| 6,110,556 | A | 8/2000 | Bang et al. | 6,627,995 B2 | 9/2003 | Paranjpe et al. |
| 6,113,699 | A | 9/2000 | Hansen | 6,630,201 B2 | 10/2003 | Chiang et al. |
| 6,113,977 | A | 9/2000 | Soininen et al. | 6,635,965 B1 | 10/2003 | Lee et al. |
| 6,117,244 | A | 9/2000 | Bang et al. | 6,645,847 B2 | 11/2003 | Paranjpe et al. |
| 6,124,158 | A | 9/2000 | Dautartas et al. | 6,660,126 B2 | 12/2003 | Nguyen et al. |
| 6,130,147 | A | 10/2000 | Major et al. | 6,686,271 B2 | 2/2004 | Raaijmakers et al. |
| 6,139,700 | A | 10/2000 | Kang et al. | 6,718,126 B2 | 4/2004 | Lei |
| 6,140,237 | A | 10/2000 | Chan et al. | 6,740,585 B2 | 5/2004 | Yoon et al. |
| 6,140,238 | A | 10/2000 | Kitch | 6,772,072 B2 | 8/2004 | Ganguli et al. |
| 6,143,659 | A | 11/2000 | Leem | 6,777,352 B2 | 8/2004 | Tepman et al. |
| 6,144,060 | A | 11/2000 | Park et al. | 6,790,773 B1 | 9/2004 | Drewery et al. |
| 6,156,382 | A | 12/2000 | Rajagopalan et al. | 6,797,340 B2 | 9/2004 | Fang et al. |
| 6,158,446 | A | 12/2000 | Mohindra et al. | 6,809,026 B2 | 10/2004 | Yoon et al. |
| 6,162,715 | A | 12/2000 | Mak et al. | 6,812,126 B1 | 11/2004 | Paranjpe et al. |
| 6,174,377 | B1 | 1/2001 | Doering et al. | 6,814,087 B2 | 11/2004 | Chandran et al. |
| 6,174,809 | B1 | 1/2001 | Kang et al. | 6,815,285 B2 | 11/2004 | Choi et al. |
| 6,200,893 | B1 | 3/2001 | Sneh | 6,818,250 B2 | 11/2004 | George et al. |
| 6,203,613 | B1 | 3/2001 | Gates et al. | 6,821,563 B2 | 11/2004 | Yudovsky |
| 6,206,967 | B1 | 3/2001 | Mak et al. | 6,827,978 B2 | 12/2004 | Yoon et al. |
| 6,207,302 | B1 | 3/2001 | Sugiura et al. | 6,831,004 B2 | 12/2004 | Byun et al. |
| 6,207,487 | B1 | 3/2001 | Kim et al. | 6,833,161 B2 | 12/2004 | Wang et al. |
| 6,218,298 | B1 | 4/2001 | Hoinkis | 6,838,376 B2 | 1/2005 | Matsuse et al. |
| 6,245,192 | B1 | 6/2001 | Dhindsa et al. | 6,846,516 B2 | 1/2005 | Yang et al. |
| 6,248,605 | B1 | 6/2001 | Harkonen et al. | 6,855,368 B1 | 2/2005 | Kori et al. |
| 6,251,190 | B1 | 6/2001 | Mak et al. | 6,861,356 B2 | 3/2005 | Matsuse et al. |
| 6,270,572 | B1 | 8/2001 | Kim et al. | 6,875,271 B2 | 4/2005 | Glenn et al. |
| 6,271,129 | B1 | 8/2001 | Ghanayem et al. | 6,893,915 B2 | 5/2005 | Park et al. |
| 6,271,148 | B1 | 8/2001 | Kao et al. | 6,905,541 B2 | 6/2005 | Chen et al. |
| 6,274,484 | B1 | 8/2001 | Tsai et al. | 6,915,592 B2 | 7/2005 | Guenther |
| 6,284,646 | B1 | 9/2001 | Leem | 6,932,871 B2 | 8/2005 | Chang et al. |
| 6,287,965 | B1 | 9/2001 | Kang et al. | 6,936,538 B2 | 8/2005 | Byun |
| 6,291,876 | B1 | 9/2001 | Stumborg et al. | 6,939,804 B2 | 9/2005 | Lai et al. |
| 6,294,836 | B1 | 9/2001 | Paranjpe et al. | 6,951,804 B2 | 10/2005 | Seutter et al. |
| 6,297,152 | B1 | 10/2001 | Itoh et al. | 6,955,211 B2 | 10/2005 | Ku et al. |
| 6,305,314 | B1 | 10/2001 | Sneh et al. | 6,958,174 B1 | 10/2005 | Klaus et al. |
| 6,306,216 | B1 | 10/2001 | Kim et al. | 6,998,014 B2 | 2/2006 | Chen et al. |
| 6,309,713 | B1 | 10/2001 | Mak et al. | 7,005,372 B2 | 2/2006 | Levy et al. |
| 6,309,966 | B1 | 10/2001 | Govindarajan et al. | 7,026,238 B2 | 4/2006 | Xi et al. |
| 6,316,098 | B1 | 11/2001 | Yitzchaik et al. | 7,033,922 B2 | 4/2006 | Kori et al. |
| 6,326,297 | B1 | 12/2001 | Vijayendran | 7,094,680 B2 | 8/2006 | Seutter et al. |
| 6,333,260 | B1 | 12/2001 | Kwon et al. | 7,101,795 B1 | 9/2006 | Xi et al. |
| 6,335,280 | B1 | 1/2002 | van der Jeugd | 7,115,494 B2 | 10/2006 | Sinha et al. |
| 6,342,277 | B1 | 1/2002 | Sherman | 7,115,499 B2 | 10/2006 | Wang et al. |
| 6,355,561 | B1 | 3/2002 | Sandhu et al. | 7,141,494 B2 | 11/2006 | Lee et al. |
| 6,358,829 | B2 | 3/2002 | Yoon et al. | 7,186,385 B2 | 3/2007 | Ganguli et al. |
| 6,365,502 | B1 | 4/2002 | Paranjpe et al. | 7,208,413 B2 | 4/2007 | Byun et al. |
| 6,368,954 | B1 | 4/2002 | Lopatin et al. | 7,211,144 B2 | 5/2007 | Lu et al. |
| 6,369,430 | B1 | 4/2002 | Adetutu et al. | 7,211,508 B2 | 5/2007 | Chung et al. |
| 6,372,598 | B2 | 4/2002 | Kang et al. | 7,220,673 B2 | 5/2007 | Xi et al. |
| 6,374,831 | B1 | 4/2002 | Chandran et al. | 7,238,552 B2 | 7/2007 | Byun |
| 6,391,785 | B1 | 5/2002 | Satta et al. | 7,262,125 B2 | 8/2007 | Wongsenakhum et al. |
| 6,399,491 | B2 | 6/2002 | Jeon et al. | 7,279,432 B2 | 10/2007 | Xi et al. |
| 6,416,822 | B1 | 7/2002 | Chiang et al. | 7,384,867 B2 | 6/2008 | Lai et al. |
| 6,420,189 | B1 | 7/2002 | Lopatin | 7,408,225 B2 | 8/2008 | Shinriki et al. |
| 6,423,619 | B1 | 7/2002 | Grant et al. | 7,416,979 B2 | 8/2008 | Yoon et al. |
| 6,428,859 | B1 | 8/2002 | Chiang et al. | 7,429,516 B2 | 9/2008 | Wang et al. |
| 6,447,933 | B2 | 9/2002 | Wang et al. | 7,465,665 B2 | 12/2008 | Xi et al. |
| 6,451,119 | B2 | 9/2002 | Sneh et al. | 7,465,666 B2 | 12/2008 | Kori et al. |
| 6,451,695 | B2 | 9/2002 | Sneh | 2001/0000866 A1 | 5/2001 | Sneh et al. |
| 6,468,924 | B2 | 10/2002 | Lee et al. | 2001/0002280 A1 | 5/2001 | Sneh |
| 6,475,276 | B1 | 11/2002 | Elers et al. | 2001/0009140 A1 | 7/2001 | Bondestam et al. |
| 6,475,910 | B1 | 11/2002 | Sneh | 2001/0009695 A1 | 7/2001 | Saanila et al. |
| 6,482,262 | B1 | 11/2002 | Elers et al. | 2001/0011526 A1 | 8/2001 | Doering et al. |
| 6,482,733 | B2 | 11/2002 | Raaijmakers et al. | 2001/0024387 A1 | 9/2001 | Raaijmakers et al. |
| 6,482,740 | B2 | 11/2002 | Soininen et al. | 2001/0028924 A1 | 10/2001 | Sherman |
| 6,524,952 | B1 | 2/2003 | Srinivas et al. | 2001/0029094 A1 | 10/2001 | Mee-Young et al. |
| 6,534,395 | B2 | 3/2003 | Werkhoven et al. | 2001/0031562 A1 | 10/2001 | Raaijmakers et al. |
| 6,534,404 | B1 | 3/2003 | Danek et al. | 2001/0034123 A1 | 10/2001 | Jeon et al. |
| 6,551,929 | B1 | 4/2003 | Kori et al. | 2001/0041250 A1 | 11/2001 | Werkhoven et al. |
| 6,569,501 | B2 | 5/2003 | Chiang et al. | 2001/0042799 A1 | 11/2001 | Kim et al. |
| 6,599,572 | B2 | 7/2003 | Saanila et al. | 2001/0054730 A1 | 12/2001 | Kim et al. |
| 6,607,976 | B2 | 8/2003 | Chen et al. | 2001/0054769 A1 | 12/2001 | Raaijmakers et al. |

| | | | | | | |
|---|---|---|---|---|---|---|
| 2002/0000598 A1 | 1/2002 | Kang et al. | | 2003/0190423 A1 | 10/2003 | Yang et al. |
| 2002/0004293 A1 | 1/2002 | Soininen et al. | | 2003/0190804 A1 | 10/2003 | Glenn et al. |
| 2002/0007790 A1 | 1/2002 | Park | | 2003/0194493 A1 | 10/2003 | Chang et al. |
| 2002/0019121 A1 | 2/2002 | Pyo | | 2003/0194825 A1 | 10/2003 | Law et al. |
| 2002/0031618 A1 | 3/2002 | Sherman | | 2003/0203616 A1 | 10/2003 | Chung et al. |
| 2002/0037630 A1 | 3/2002 | Agarwal et al. | | 2003/0224217 A1 | 12/2003 | Byun et al. |
| 2002/0048880 A1 | 4/2002 | Lee | | 2003/0232497 A1 | 12/2003 | Xi et al. |
| 2002/0052097 A1 | 5/2002 | Park | | 2004/0005749 A1 | 1/2004 | Choi et al. |
| 2002/0055235 A1 | 5/2002 | Agarwal et al. | | 2004/0009307 A1 | 1/2004 | Koh et al. |
| 2002/0060363 A1 | 5/2002 | Xi et al. | | 2004/0011504 A1 | 1/2004 | Ku et al. |
| 2002/0061612 A1 | 5/2002 | Sandhu et al. | | 2004/0013577 A1 | 1/2004 | Ganguli et al. |
| 2002/0068458 A1 | 6/2002 | Chiang et al. | | 2004/0014315 A1 | 1/2004 | Lai et al. |
| 2002/0073924 A1 | 6/2002 | Chiang et al. | | 2004/0014320 A1 | 1/2004 | Chen et al. |
| 2002/0076481 A1 | 6/2002 | Chiang et al. | | 2004/0015300 A1 | 1/2004 | Ganguli et al. |
| 2002/0076507 A1 | 6/2002 | Chiang et al. | | 2004/0018304 A1 | 1/2004 | Chung et al. |
| 2002/0076508 A1 | 6/2002 | Chiang et al. | | 2004/0018723 A1 | 1/2004 | Byun et al. |
| 2002/0076837 A1 | 6/2002 | Hujanen et al. | | 2004/0025370 A1 | 2/2004 | Guenther |
| 2002/0086111 A1 | 7/2002 | Byun et al. | | 2004/0041320 A1 | 3/2004 | Hodumi |
| 2002/0086507 A1 | 7/2002 | Park et al. | | 2004/0065255 A1 | 4/2004 | Yang et al. |
| 2002/0090829 A1 | 7/2002 | Sandhu et al. | | 2004/0067641 A1 | 4/2004 | Yudovsky |
| 2002/0094689 A1 | 7/2002 | Park | | 2004/0170403 A1 | 9/2004 | Lei |
| 2002/0102838 A1 | 8/2002 | Paranjpe et al. | | 2004/0202786 A1 | 10/2004 | Wongsenakhum |
| 2002/0104467 A1 | 8/2002 | Chandran et al. | | 2004/0209460 A1 | 10/2004 | Xi et al. |
| 2002/0104481 A1 | 8/2002 | Chiang et al. | | 2004/0209465 A1 | 10/2004 | Xi et al. |
| 2002/0105088 A1 | 8/2002 | Yang et al. | | 2004/0211665 A1 | 10/2004 | Yoon et al. |
| 2002/0106846 A1 | 8/2002 | Seutter et al. | | 2004/0247788 A1 | 12/2004 | Fang et al. |
| 2002/0109168 A1 | 8/2002 | Kim et al. | | 2005/0006799 A1 | 1/2005 | Gregg et al. |
| 2002/0117399 A1 | 8/2002 | Chen et al. | | 2005/0008779 A1 | 1/2005 | Yang et al. |
| 2002/0121241 A1 | 9/2002 | Nguyen et al. | | 2005/0009325 A1 | 1/2005 | Chung et al. |
| 2002/0121342 A1 | 9/2002 | Nguyen et al. | | 2005/0031786 A1 | 2/2005 | Lee et al. |
| 2002/0121697 A1 | 9/2002 | Marsh | | 2005/0059241 A1 | 3/2005 | Kori et al. |
| 2002/0144655 A1 | 10/2002 | Chiang et al. | | 2005/0118804 A1 | 6/2005 | Byun et al. |
| 2002/0144657 A1 | 10/2002 | Chiang et al. | | 2005/0164487 A1 | 7/2005 | Seutter et al. |
| 2002/0146511 A1 | 10/2002 | Chiang et al. | | 2005/0176240 A1 | 8/2005 | Wang et al. |
| 2002/0155722 A1 | 10/2002 | Satta et al. | | 2005/0189072 A1 | 9/2005 | Chen et al. |
| 2002/0162506 A1 | 11/2002 | Sneh et al. | | 2005/0191803 A1 | 9/2005 | Matsuse et al. |
| 2002/0164421 A1 | 11/2002 | Chiang et al. | | 2005/0208217 A1 | 9/2005 | Shinriki et al. |
| 2002/0164423 A1 | 11/2002 | Chiang et al. | | 2005/0208763 A1 | 9/2005 | Byun et al. |
| 2002/0182320 A1 | 12/2002 | Leskela et al. | | 2005/0257735 A1 | 11/2005 | Guenther et al. |
| 2002/0187256 A1 | 12/2002 | Elers et al. | | 2005/0271814 A1 | 12/2005 | Chang et al. |
| 2002/0187631 A1 | 12/2002 | Kim et al. | | 2005/0287807 A1 | 12/2005 | Lai et al. |
| 2002/0197402 A1 | 12/2002 | Chiang et al. | | 2006/0009034 A1 | 1/2006 | Lai et al. |
| 2002/0197856 A1 | 12/2002 | Matsuse et al. | | 2006/0024959 A1 | 2/2006 | Li et al. |
| 2002/0197863 A1 | 12/2002 | Mak et al. | | 2006/0030148 A1 | 2/2006 | Seutter et al. |
| 2003/0013300 A1 | 1/2003 | Byun | | 2006/0040052 A1 | 2/2006 | Feng et al. |
| 2003/0013320 A1 | 1/2003 | Kim et al. | | 2006/0075966 A1 | 4/2006 | Chen et al. |
| 2003/0022487 A1 | 1/2003 | Yoon et al. | | 2006/0128132 A1 | 6/2006 | Sinha et al. |
| 2003/0029715 A1 | 2/2003 | Yu et al. | | 2006/0128150 A1 | 6/2006 | Gandikota et al. |
| 2003/0031807 A1 | 2/2003 | Elers et al. | | 2006/0156979 A1 | 7/2006 | Thakur et al. |
| 2003/0032281 A1 | 2/2003 | Werkhoven et al. | | 2006/0199372 A1 | 9/2006 | Chung et al. |
| 2003/0034560 A1 | 2/2003 | Matsuse et al. | | 2006/0257295 A1 | 11/2006 | Chen et al. |
| 2003/0038369 A1 | 2/2003 | Layadi et al. | | 2006/0264031 A1 | 11/2006 | Xi et al. |
| 2003/0049931 A1 | 3/2003 | Byun et al. | | 2006/0276020 A1 | 12/2006 | Yoon et al. |
| 2003/0049942 A1 | 3/2003 | Haukka et al. | | 2006/0292874 A1 | 12/2006 | Kori et al. |
| 2003/0053799 A1 | 3/2003 | Lei | | 2007/0003698 A1 | 1/2007 | Chen et al. |
| 2003/0054631 A1 | 3/2003 | Raaijmakers et al. | | 2007/0009658 A1 | 1/2007 | Yoo et al. |
| 2003/0072975 A1 | 4/2003 | Shero et al. | | 2007/0020890 A1 | 1/2007 | Thakur et al. |
| 2003/0082296 A1 | 5/2003 | Elers et al. | | 2007/0020924 A1 | 1/2007 | Wang et al. |
| 2003/0082301 A1 | 5/2003 | Chen et al. | | 2007/0026147 A1 | 2/2007 | Chen et al. |
| 2003/0104126 A1 | 6/2003 | Fang et al. | | 2007/0067609 A1 | 3/2007 | Chen et al. |
| 2003/0116087 A1 | 6/2003 | Nguyen et al. | | 2007/0099415 A1 | 5/2007 | Chen et al. |
| 2003/0123216 A1 | 7/2003 | Yoon et al. | | 2007/0119370 A1 | 5/2007 | Ma et al. |
| 2003/0127043 A1 | 7/2003 | Lu et al. | | 2007/0119371 A1 | 5/2007 | Ma et al. |
| 2003/0129826 A1 | 7/2003 | Werkhoven et al. | | 2007/0128862 A1 | 6/2007 | Ma et al. |
| 2003/0134508 A1 | 7/2003 | Raaijmakers et al. | | 2007/0128863 A1 | 6/2007 | Ma et al. |
| 2003/0143328 A1 | 7/2003 | Chen et al. | | 2007/0128864 A1 | 6/2007 | Ma et al. |
| 2003/0143839 A1 | 7/2003 | Raaijmakers et al. | | 2007/0190780 A1 | 8/2007 | Chung et al. |
| 2003/0153177 A1 | 8/2003 | Tepman | | 2007/0197027 A1 | 8/2007 | Byun et al. |
| 2003/0153181 A1 | 8/2003 | Yoon et al. | | 2007/0197028 A1 | 8/2007 | Byun et al. |
| 2003/0157760 A1 | 8/2003 | Xi et al. | | 2008/0008823 A1 | 1/2008 | Chen et al. |
| 2003/0161952 A1 | 8/2003 | Wang et al. | | 2008/0014352 A1 | 1/2008 | Xi et al. |
| 2003/0181035 A1 | 9/2003 | Yoon et al. | | 2008/0014724 A1 | 1/2008 | Byun |
| 2003/0186495 A1 | 10/2003 | Saanila et al. | | 2008/0206987 A1 | 8/2008 | Gelatos et al. |

| | | | |
|---|---|---|---|
| 2008/0227291 A1 | 9/2008 | Lai et al. | |
| 2008/0268636 A1 | 10/2008 | Yoon et al. | |
| 2008/0305629 A1 | 12/2008 | Wang et al. | |
| 2008/0317954 A1 | 12/2008 | Lu et al. | |

FOREIGN PATENT DOCUMENTS

| | | |
|---|---|---|
| DE | 198 20 147 | 7/1999 |
| EP | 0 344 352 | 12/1989 |
| EP | 0 429 270 | 5/1991 |
| EP | 0 442 490 | 8/1991 |
| EP | 0 704 551 | 3/1996 |
| EP | 0 799 641 | 10/1997 |
| EP | 1 167 569 | 1/2002 |
| FR | 2 626 110 | 7/1989 |
| FR | 2 692 597 | 12/1993 |
| GB | 2 355 727 | 5/2001 |
| JP | 58-098917 | 6/1983 |
| JP | 58-100419 | 6/1983 |
| JP | 60-065712 | 4/1985 |
| JP | 61-035847 | 2/1986 |
| JP | 61-210623 | 9/1986 |
| JP | 62-069508 | 3/1987 |
| JP | 62-091495 | 4/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 63-266814 | 11/1988 |
| JP | 64-009895 | 1/1989 |
| JP | 64-009896 | 1/1989 |
| JP | 64-009897 | 1/1989 |
| JP | 64-037832 | 2/1989 |
| JP | 64-082615 | 3/1989 |
| JP | 64-082617 | 3/1989 |
| JP | 64-082671 | 3/1989 |
| JP | 64-082676 | 3/1989 |
| JP | 01-103982 | 4/1989 |
| JP | 01-103996 | 4/1989 |
| JP | 64-090524 | 4/1989 |
| JP | 01-117017 | 5/1989 |
| JP | 01-143221 | 6/1989 |
| JP | 01-143233 | 6/1989 |
| JP | 01-154511 | 6/1989 |
| JP | 01-236657 | 9/1989 |
| JP | 01-245512 | 9/1989 |
| JP | 01-264218 | 10/1989 |
| JP | 01-270593 | 10/1989 |
| JP | 01-272108 | 10/1989 |
| JP | 01-290221 | 11/1989 |
| JP | 01-290222 | 11/1989 |
| JP | 01-296673 | 11/1989 |
| JP | 01-303770 | 12/1989 |
| JP | 01-305894 | 12/1989 |
| JP | 01-313927 | 12/1989 |
| JP | 02-012814 | 1/1990 |
| JP | 02-014513 | 1/1990 |
| JP | 02-017634 | 1/1990 |
| JP | 02-063115 | 3/1990 |
| JP | 02-074029 | 3/1990 |
| JP | 02-074587 | 3/1990 |
| JP | 02-106822 | 4/1990 |
| JP | 02-129913 | 5/1990 |
| JP | 02-162717 | 6/1990 |
| JP | 02-172895 | 7/1990 |
| JP | 02-196092 | 8/1990 |
| JP | 02-203517 | 8/1990 |
| JP | 02-230690 | 9/1990 |
| JP | 02-230722 | 9/1990 |
| JP | 02-246161 | 10/1990 |
| JP | 02-264491 | 10/1990 |
| JP | 02-283084 | 11/1990 |
| JP | 02-304916 | 12/1990 |
| JP | 03-019211 | 1/1991 |
| JP | 03-022569 | 1/1991 |
| JP | 03-023294 | 1/1991 |
| JP | 03-023299 | 1/1991 |
| JP | 03-044967 | 2/1991 |
| JP | 03-048421 | 3/1991 |
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 03-286531 | 12/1991 |
| JP | 04-031391 | 2/1992 |
| JP | 04-031396 | 2/1992 |
| JP | 04-064223 | 2/1992 |
| JP | 04-100292 | 4/1992 |
| JP | 04-111418 | 4/1992 |
| JP | 04-132214 | 5/1992 |
| JP | 04-132681 | 5/1992 |
| JP | 04-151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04226029 | 8/1992 |
| JP | 04-260696 | 9/1992 |
| JP | 04-273120 | 9/1992 |
| JP | 04-285167 | 10/1992 |
| JP | 04-291916 | 10/1992 |
| JP | 04-325500 | 11/1992 |
| JP | 04-328874 | 11/1992 |
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 6-60402 | 3/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |

| | | |
|---|---|---|
| JP | 08-245291 | 9/1996 |
| JP | 08-264530 | 10/1996 |
| JP | 62-033768 | 2/1997 |
| JP | 09-260786 | 10/1997 |
| JP | 09-293681 | 11/1997 |
| JP | 10-188840 | 7/1998 |
| JP | 10-190128 | 7/1998 |
| JP | 10212583 | 8/1998 |
| JP | 10-308283 | 11/1998 |
| JP | 10294295 | 11/1998 |
| JP | 10-335264 | 12/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-319772 | 3/2000 |
| JP | 2000-138094 | 5/2000 |
| JP | 2000-178735 | 6/2000 |
| JP | 2000-218445 | 8/2000 |
| JP | 2000-319773 | 11/2000 |
| JP | 2000-340883 | 12/2000 |
| JP | 2000-353666 | 12/2000 |
| JP | 2001-020075 | 1/2001 |
| JP | 2001-062244 | 3/2001 |
| JP | 2001-111000 | 4/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| JP | 2001525492 | 12/2001 |
| WO | WO 90/02216 | 3/1990 |
| WO | WO 91/10510 | 7/1991 |
| WO | WO 93/02111 | 2/1993 |
| WO | WO 96/17107 | 6/1996 |
| WO | WO 96/18756 | 6/1996 |
| WO | WO 98/06889 | 2/1998 |
| WO | WO 98/51838 | 11/1998 |
| WO | WO 99/01595 | 1/1999 |
| WO | WO 99/13504 | 3/1999 |
| WO | WO-99/019260 | 4/1999 |
| WO | WO 99/29924 | 6/1999 |
| WO | WO 99/41423 | 8/1999 |
| WO | WO 00/11721 | 3/2000 |
| WO | WO 00/15865 | 3/2000 |
| WO | WO 00/15881 | 3/2000 |
| WO | WO 00/16377 | 3/2000 |
| WO | WO-0026952 | 5/2000 |
| WO | WO 00/54320 | 9/2000 |
| WO | WO 00/63957 | 10/2000 |
| WO | WO 00/79019 | 12/2000 |
| WO | WO 00/79576 | 12/2000 |
| WO | WO 01/15220 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 02/01628 | 1/2002 |
| WO | WO 02/45167 | 6/2002 |
| WO | WO 02/45871 | 6/2002 |
| WO | WO 02/46489 | 6/2002 |
| WO | WO 02/067319 | 8/2002 |
| WO | WO 2004/106584 | 12/2004 |
| WO | WO 2005/027211 | 3/2005 |

OTHER PUBLICATIONS

Cheong, et al. "The Evaluation of ALD-WN/W Process for Sub-70nm Contact Plug Technology," ALD 2005 Conference.

Elam, et al. "Kinetics of the $WF_6$ and $Si_2H_6$ surface reactions during tungsten atomic layer deposition," Surface Science, 479, 2001, pp. 121-135.

Fabreguette, et al. "Quartz crystal microbalance study of tungsten atomic layer deposition using $WF_6$ and $Si_2H_6$," Thin Solid Films, 488, 2005, pp. 103-110.

Fabreguette, et al. "Ultrahigh x-ray reflectivity from $W/Al_2O_3$ multilayers fabricated using atomic layer deposition," Applied Physics Letter, 88, 2006, pp. 013116-1-013116-3.

Frohberg et al. " Filling contacts using a pulsed nucleation later of tungsten nitride," Micro: TechEmergent, Mar. 27, 2006, pp. 1-10, http://www.micormagazine.com/archive/05/10/frohberg.html.

Grubbs, et al. "Gas phase reaction products during tungsten atomic layer deposition using $WF_6$ and $Si_2H_6$," J. Vac. Sci. Technol., B, vol. 22, No. 4, Jul./Aug. 2004, American Vacuum Society, pp. 1811-1821.

Grubbs, et al. "Nucleation and growth during the atomic layer deposition of W on $Al_2O_3$ and $Al_2O_3$ on W," Thin Solid Films, 467, 2004, pp. 16-27.

Kang "Applications and challenges of atomic layer deposition for semiconductor process," AVS $5^{th}$ International Conference on Atomic Layer Deposition 2005, Aug. 8-10, 2005, San Jose, CA.

Kim et al. "Atomic layer deposited tungsten nitride thin film as contact barrier layer for sub-80 nm dynamic random access memory," Conference Proceedings AMC XXI, 2006 Materials Research Society.

Klaus et al. "Atomic Layer Deposition of Tungsten Using Sequential Surface Chemistry with a Sacrificial Stripping Reaction," Thin Solid Films, 360, 2000, pp. 145-153.

Klaus, et al. "Atomic Layer Deposition of Tungsten Nitride Films Using Sequential Surface Reactions," Journal of the Electrochemical Society, vol. 147, No. 3, 2000, pp. 1175-1181.

Sechrist, et al. "Optimization and Structural Characterization of $W/Al_2O_3$ Nanolaminates Grown Using Atomic Layer Deposition Techniques," Chem. Matter, 17, 2005, American Chemical Society, pp. 3475-3485.

Notice to File a Response of Korean Patent Application No. 10-2004-7009362 dated Apr. 10, 2009.

Ashtiani, et al. "Pulsed Nucleation Layer of Tungsten Nitride Barrier Film and its Application in DRAM and Logic Manufacturing," SEMI Technical Symposium: Innovations in Semiconductor Manufacturing (STS:ISM), SEMICON Korea 2006, Semiconductor Equipment and Materials International, pp. 1-6.

Bader, et al. "Integrated Processing Equipment," Solid State Technology, Cowan Pub., vol. 33, No. 5 (May 1, 1990), pp. 149-154.

Bedair "Atomic layer epitaxy deposition processes", *J. Vac. Sci. Techol.* 12(1) (Jan./Feb. 1994).

Choi, et al. "Stability of $TiB_2$ 2 as a Diffusion Barrier on Silicon", J. Electrochem. Soc. 138(10) (Oct. 1991), pp. 3062-3067.

Choi, et al. "The effect of annealing on resistivity of low pressure chemical vapor deposited titanium diboride", J. Appl. Phys. 69(11) (Jun. 1, 1991), pp. 7853-7861.

Derbyshire "Applications of Integrated processing," Solid State Technology, US, Cowan Pub., vol. 37, No. 12 (Dec. 1, 1994), pp. 45-47.

Elam, et al. "Nucleation and Growth During Tungsten Atomic Layer Deposition on $SiO_2$ Surfaces," Thin Solid Films, 386, (2001), pp. 41-52.

Elers, et al. "NbC15 as a precursor in atomic layer epitaxy", *Appl. Surf. Sci.*, vol. 82/83 (1994), pp. 468-474.

European Examination Report dated Feb. 9, 2006 for European Application No. 02 756 489.7-2119.

George, et al. "Atomic layer controlled deposition of $SiO_2$ and $Al_2O_3$ using ABAB . . . binary reaction sequence chemistry", *Appl. Surf. Sci.*, vol. 82/83 (1994), pp. 460-467.

George, et al. "Surface Chemistry for Atomic Layer Growth", *J. Phys. Chem.*, vol. 100 (1996), pp. 13121-13131.

Goswami, et al. Transition Metals Show Promise as Copper Barriers, Semiconductor International, ATMI, San Jose—May 1, 2004, Semiconductor International, pp. 1-7.

Hultman, et al. "Review of the thermal and mechanical stability of TiN-based thin films", *Zeitschrift Fur Metallkunde*, 90(10) (Oct. 1999), pp. 803-813.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

International Search Report dated Mar. 12, 2004 for International Application No. PCT/US03/22477.

International Search Report dated Nov. 25, 2002 for International Application No. PCT/US02/22486.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kitigawa, et al. "Hydrogen-mediated low temperature epitaxy of Si in plasma-enhanced chemical vapor deposition", Applied Surface Science (2000), pp. 30-34.

Klaus, et al. "Atomic Layer Deposition of $SiO_2$ Using Catalyzed and Uncatalyzed Self-Limiting Surface Reactions", *Surface Review & Letters*, 6(3&4) (1999), pp. 435-448.

Klaus, et al. "Atomically Controlled Growth of Tungsten and Tungsten Nitride Using Sequential Surface Reactions," Applied Surface Science, 162-163 (2000), pp. 479-491.

Lee "The Preparation of Titanium-Based Thin Film by CVD Using Titanium Chlorides as Precursors", *Chemical Vapor Deposition*, 5(2) (Mar. 1999), pp. 69-73.

Lee, et al. "Pulsed Nucleation for Ultra-High Aspect Ratio Tungsten Plugfill," Conference Proceedings ULSI XVIII, Materials Research Society, 2002, pp. 649-653.

Martensson, et al. "Atomic Layer Epitaxy of Copper on Tantalum", Chemical Vapor Deposition, 3(1) (Feb. 1, 1997), pp. 45-50.

Martensson, et al. "Atomic Layer Epitaxy of Copper, Growth & Selectivity in the Cu (II)-2,2.6,6-Tetramethyl-3, 5-Heptanedion ATE/H2 Process", *J. Electrochem. Soc.* 145(8) (Aug. 1998), pp. 2926-2931.

Maydan "Cluster Tools for Fabrication of Advanced devices," Jap. J. of Applied Physics, Extended Abstracts, $22^{nd}$ Conference Solid State Devices and Materials (1990), pp. 849-852, XP000178141.

McGeachin "Synthesis and properties of some β-diketimines derived from acetylacetone, and their metal complexes", Canadian J. of Chemistry, vol. 46 (1968), pp. 1903-1912.

Min, et al. "Atomic layer deposition of TiN thin films by sequential introduction of Ti precursor and NH/sub3/", *Symp.: Advanced Interconnects and Contact Materials and Processes for Future Integrated Circuits* (Apr. 13-16, 1998), pp. 337-342.

Min, et al. "Metal-Organic Atomic-Layer Deposition of Titanium-Silicon-Nitride Films", *Applied Physics Letters*, American Inst. Of Physics, vol. 75(11) (Sep. 13, 1999).

Min, et al."Chemical Vapor Deposition of Ti-Si-N Films with Alternating Source Supply", *Mat., Res. Soc. Symp. Proc.*, vol. 564 (Apr. 5, 1999), pp. 207-210.

Niinisto, et al. "Synthesis of oxide thin films and overlayers by atomic layer epitaxy for advanced applications", *Mat. Sci. & Eng.*, vol. B41 (1996), pp. 23-29.

Ohba, et al. "Thermal Decomposition of Methylhydrazine and Deposition Properties of CVD TiN Thin Films", Conference Proceedings, Advanced Metallization for ULSI Applications in 1993 (1994), pp. 143-149.

Ritala, et al. "Atomic Layer Epitaxy Growth of TiN Thin Films", *J. Electrochem. Soc.*, 142(8) (Aug. 1995), pp. 2731-2737.

Ritala, et al. "Perfectly conformal TiN and $Al_2O_3$ films deposited by atomic layer deposition," *Chemical Vapor Deposition*, vol. 5(1) (Jan. 1999), pp. 7-9.

Scheper, et al. "Low-temperature deposition of titanium nitride films from dialkylhydrazine-based precursors," Materials Science in Semiconductor Processing 2 (1999), pp. 149-157.

Solanki, et al. "Atomic Layer deposition of Copper Seed Layers", Electrochemical and Solid State Letters, 3(10) (2000), pp. 479-480.

Sone, et al. "Formation of Low Pressure Chemically Vapour Deposited W Thin Film on Silicon Dioxide for Gate Electrode Application," Thin Solid Films 253 (1994) 377-381.

Suzuki, et al. "A 0.2-μm contact filing by 450° C-hydrazine-reduced TiN film with low resistivity", IEDM 92-979, pp. 11.8.1-11.8.3.

Suzuki, et al. "LPCVD-TiN Using Hydrazine and $TiCl_4$", VMIC Conference (Jun. 8-9, 1993), pp. 418-423.

Wise, et al. "Diethyldiethoxysilane as a new precursor for $SiO_2$ growth on silicon", *Mat. Res. Soc. Symp. Proc.*, vol. 334 (1994), pp. 37-43.

Yamaga, et al. "Atomic layer epitaxy of ZnS by a new gas supplying system in a low-pressure metalorganic vapor phase epitaxy", *J. of Crystal Growth* 117 (1992), pp. 152-155.

Yamaguchi, et al. "Atomic-layer chemical-vapor-deposition of silicon dioxide films with extremely low hydrogen content", *Appl. Surf. Sci.*, vol. 130-132 (1998), pp. 202-207.

Yang, et al. "Atomic Layer Deposition of Tungsten Film from $WF_6$/$B_2H_6$: Nucleation Layer for Advanced Semiconductor Devices," Conference Proceedings ULSI XVII (2002), Materials Research Society, pp. 655-660.

Notice of Reasons for Rejection dated Jun. 17, 2008 (Japanese Patent Application No. P2003-564311).

Office Action dated Jul. 7, 2009 for Japanese Patent Application No. 2004-521971.

PULSED DEPOSITION PROCESS FOR TUNGSTEN NUCLEATION

CROSS-REFERENCE TO RELATED APPLICATIONS

This application is a continuation of U.S. Ser. No. 10/194,629 (APPM/005730.Y1), filed Jul. 12, 2002, now issued as U.S. Pat. No. 7,211,144, which is a continuation-in-part of U.S. Ser. No. 10/023,125 (APPM/005730), filed Dec. 17, 2001, now abandoned, which claims benefit of U.S. Ser. No. 60/305,307 (APPM/005730L), filed Jul. 13, 2001, which are herein incorporated by reference in their entirety.

BACKGROUND OF THE INVENTION

1. Field of the Invention

The present invention generally relates to a method of forming tungsten layers and, more particularly forming tungsten layers using a pulsed nucleation deposition process.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components as well as improved layer uniformity.

In particular, metal layers, such as those used for interconnect, contact, and plug fill applications, are subject to increasingly stringent requirements related to step coverage and layer uniformity. Tungsten layers, for example, are particularly difficult to deposit with uniform step coverage. Typically, tungsten layers are formed by chemical vapor deposition (CVD), using a two step process. A bulk tungsten layer is typically deposited by reacting tungsten hexafluoride ($WF_6$) with hydrogen ($H_2$) on a substrate. In order to reduce the time required to initiate the reaction between the tungsten hexafluoride and the hydrogen (i.e., reduce the "incubation time"), a nucleation layer is typically deposited prior to depositing the bulk tungsten layer. Unfortunately, the nucleation layer, typically deposited by reacting tungsten hexafluoride with silane ($SiH_4$), has sub-optimal step coverage. As a result, voids may form in the tungsten nucleation layer during deposition, adversely impacting the electrical performance of devices fabricated therefrom.

Therefore, a need exists in the art for a method of depositing a tungsten nucleation layer with improved step coverage.

SUMMARY OF THE INVENTION

Embodiments of the invention generally relate to a method of forming a tungsten nucleation layer using a sequential deposition process. The tungsten nucleation layer is formed by reacting pulses of a tungsten-containing precursor and a reducing gas in a process chamber to deposit tungsten on the substrate. Thereafter, reaction by-products generated from the tungsten deposition are removed from the process chamber. After the reaction byproducts are removed from the process chamber, a flow of the reducing gas is provided to the process chamber to react with residual tungsten-containing precursor remaining therein. Such a deposition process forms tungsten nucleation layers having good step coverage. The sequential deposition process of reacting pulses of the tungsten-containing precursor and the reducing gas, removing reaction by-products, and than providing a flow of the reducing gas to the process chamber may be repeated until a desired thickness for the tungsten nucleation layer is formed.

The formation of the tungsten nucleation layer is compatible with integrated circuit fabrication processes. In one integrated circuit fabrication process, the tungsten nucleation layer is formed prior to tungsten plug formation. For such an embodiment, a preferred process sequence includes depositing a tungsten nucleation layer in apertures defined in a dielectric material layer formed on a substrate. The tungsten nucleation layer is formed using a sequential deposition process in which pulses of a tungsten-containing precursor and a reducing gas are reacted, reaction by-products removed, and then a flow of reducing gas is provided to a process chamber. The sequential deposition process may be repeated until a desired thickness for the tungsten nucleation layer is deposited. Thereafter, the tungsten plug is completed when a bulk tungsten layer is deposited on the tungsten nucleation layer to fill the apertures.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
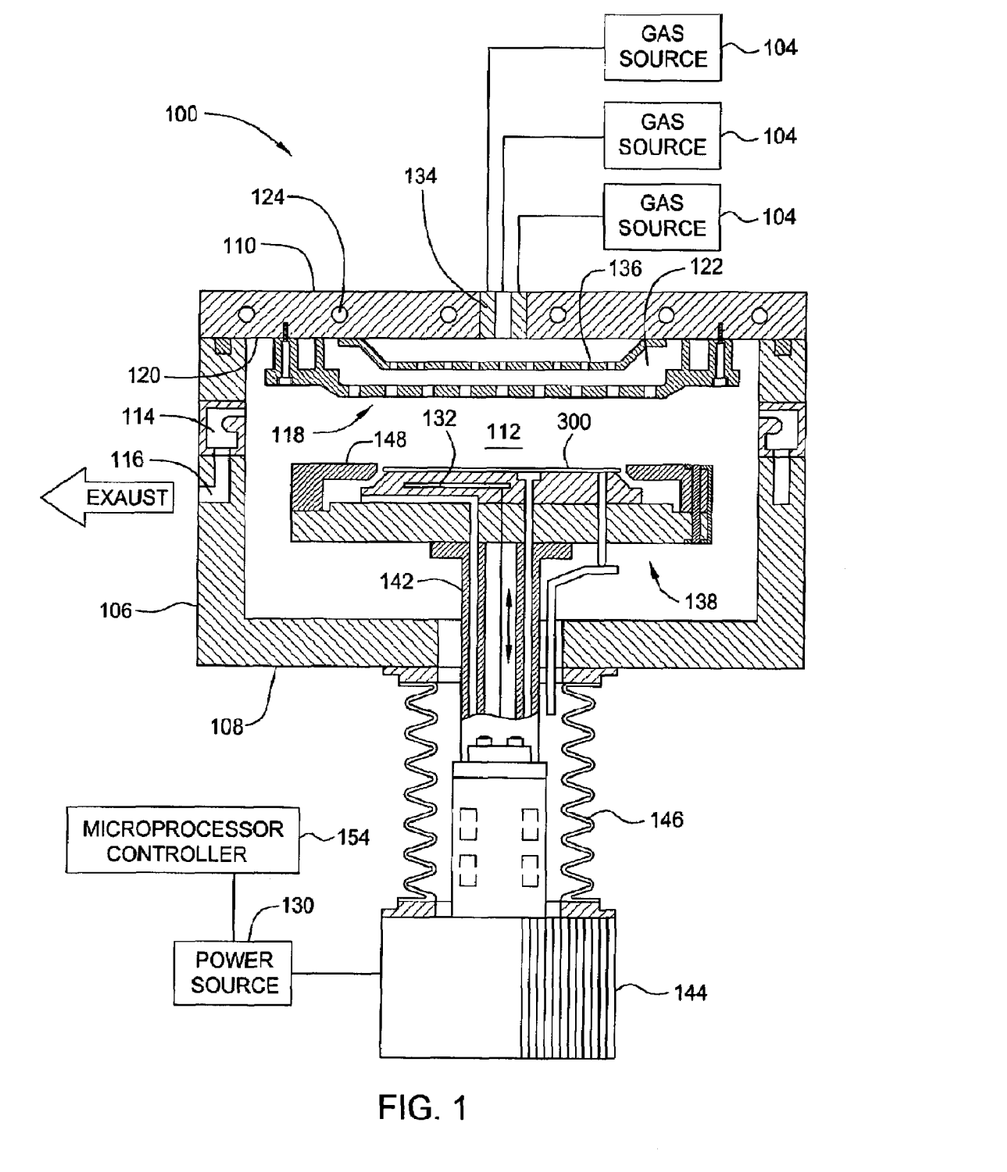
FIG. 1 is a schematic cross-sectional view of a processing chamber that may be used to practice embodiments described herein.

Embodiments described herein relate to a method for depositing a tungsten nucleation layer on a substrate. FIG. 1 depicts a schematic cross-sectional view of a chemical vapor deposition (CVD) process chamber 100 that may be used to practice embodiments of the invention described herein. The process chamber 100 may be part of a processing system (not shown) that includes multiple processing chambers connected to a central transfer chamber (not shown) and serviced by a robot (not shown).

The process chamber 100 includes walls 106, a bottom 108, and a lid 110 that define a process volume 112. The walls 106 and bottom 108 are typically fabricated from a unitary block of aluminum. The walls 106 may have conduits (not shown) therein through which a fluid may be passed to control the temperature of the walls 106. The process chamber 100 may also include a pumping ring 114 that couples the process volume 112 to an exhaust port 116 as well as other pumping components (not shown).

A heated support assembly 138 is centrally disposed within the process chamber 100. The support assembly 138 supports a substrate 300 during a deposition process. The support assembly 138 generally is fabricated from aluminum, ceramic or a combination of aluminum and ceramic and typically includes a vacuum port (not shown) and at least one or more heating elements 132.

The vacuum port may be used to apply a vacuum between the substrate 300 and the substrate support 138, so as to secure the substrate 300 to the substrate support 138 during the deposition process. The one or more heating elements 132, may be, for example, electrodes disposed in the substrate support 138, and coupled to a power source 130, to heat the substrate support 138 and substrate 300 positioned thereon to a predetermined temperature.

Generally, the support assembly 138 is coupled to a stem 142. The stem 142 provides a conduit for electrical leads, vacuum and gas supply lines between the support assembly 138 and other components of the process chamber 100. Additionally, the stem 142 couples the support assembly 138 to a lift system 144 that moves the support assembly 138 between an elevated position (as shown in FIG. 1) and a lowered position (not shown). Bellows 146 provide a vacuum seal between the chamber volume 112 and the atmosphere outside the process chamber 100 while facilitating the movement of the support assembly 138.

The support assembly 138 additionally supports a circumscribing shadow ring 148. The shadow ring 148 is annular in form and typically comprises a ceramic material such as, for example, aluminum nitride. Generally, the shadow ring 148 prevents deposition at the edge of the substrate 300 and support assembly 138.

The lid 110 is supported by the walls 106 and may be removed to service the process chamber 100. The lid 110 is generally comprised of aluminum and may additionally have heat transfer fluid channels 124 formed therein. The heat transfer fluid channels 124 are coupled to a fluid source (not shown) that flows a heat transfer fluid through the lid 110. Fluid flowing through the channels 124 regulates the temperature of the lid 110.

A mixing block 134 is disposed in the lid 110. The mixing block 134 is coupled to gas sources 104. Generally, individual gas streams from the gas sources 104 are combined in the mixing block 134. These gases are mixed into a single homogeneous gas flow in the mixing block 134 and introduced into the process volume 112 after passing through a showerhead 118 that diffuses the gas flow outwardly towards the chamber walls 106.

The showerhead 118 is generally coupled to an interior side 120 of the lid 110. A perforated blocker plate 136 may optionally be disposed in the plenum 122 between the showerhead 118 and lid 110. Gases (i.e., process and other gases) that enter the process chamber 100 through the mixing block 134 are first diffused by the blocker plate 136 as the gases fill the plenum 122 behind the showerhead 118. The gases then pass through the showerhead 118 and the process chamber 100. The blocker plate 136 and the showerhead 118 are configured to provide a uniform flow of gases to the process chamber 100. Uniform gas flow is desirable to promote uniform layer formation on the substrate 300.

The CVD process chamber 100 is controlled by a microprocessor controller 154. The microprocessor controller may be one of any form of general purpose computer processor (CPU) that can be used in an industrial setting for controlling various chambers and sub-processors. The computer processor may use any suitable memory, such as random access memory, read only memory, floppy disc drive, hard disk, or any other form of digital storage local or remote. Various support circuits may be coupled to the CPU for supporting the processor in a conventional manner. Software routines as required may be stored in the memory or executed by a second CPU that is remotely located.

The software routines are executed after the substrate is positioned on the substrate support. The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Tungsten Nucleation Layer Formation

Figure 2:
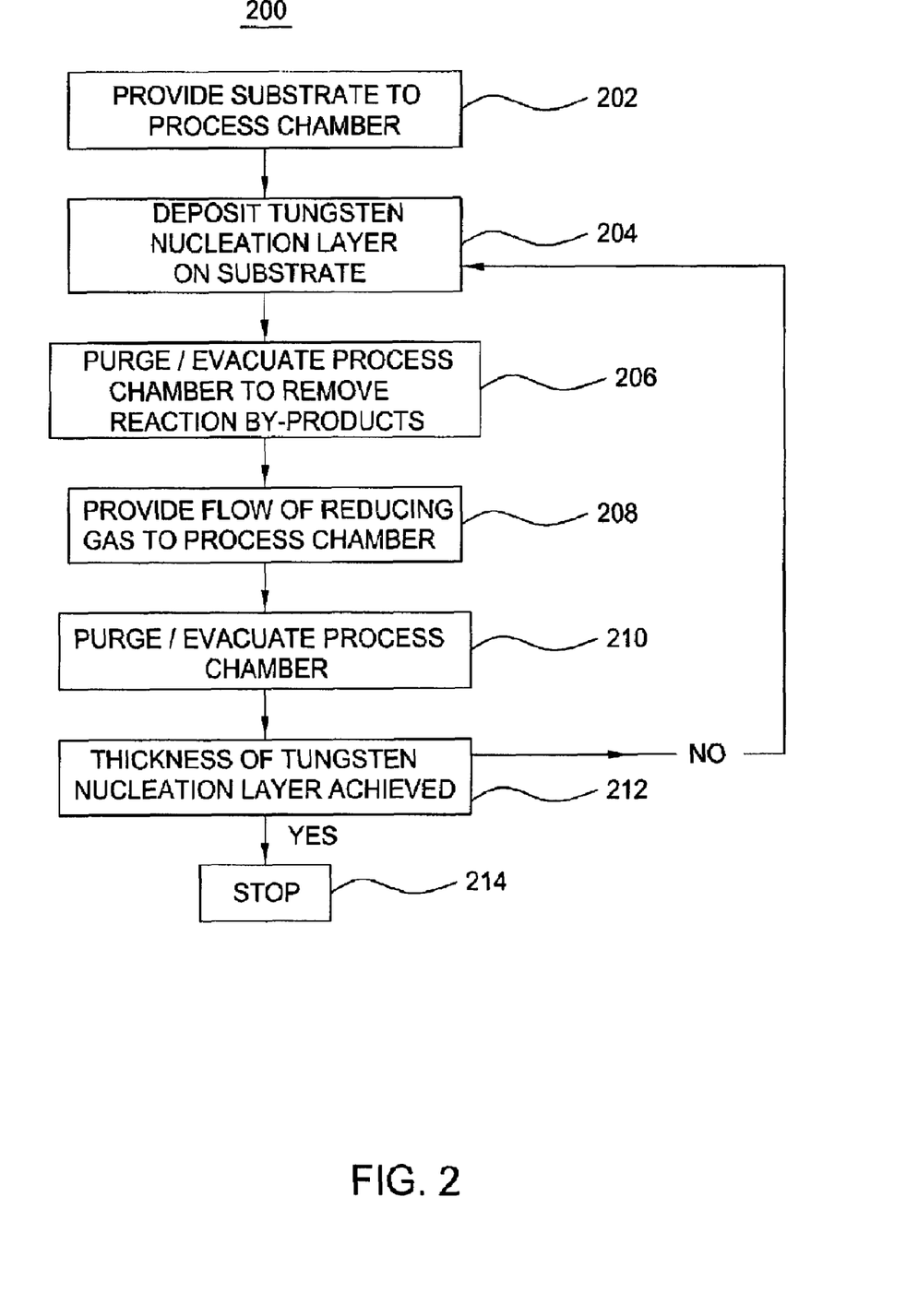
FIG. 2 illustrates a process sequence for tungsten nucleation layer formation using deposition techniques according to embodiments described herein.

FIG. 2 illustrates a process sequence 200 detailing the various steps used for the formation of a tungsten nucleation layer. These steps may be performed in a CVD process chamber similar to that described above with reference to FIG. 1. As shown in step 202, a substrate is provided to the CVD process chamber. The substrate may be, for example, a silicon substrate, which may or may not have one or more material layers disposed thereon. The one or more material layers, for example, may be an oxide layer having a sub-quarter micron aperture therein. Sub-quarter micron apertures typically have aspect ratios (e.g., the feature width divided by the feature length) greater than about 8:1.

The sub-quarter micron features may have a barrier layer formed therein. The barrier layer may be, for example, titanium nitride. The barrier layer generally serves to prevent diffusion of the tungsten into surrounding material layers and to enhance the adhesion of the tungsten layer.

In step 204, a tungsten nucleation layer is deposited on the substrate conformably in the sub-quarter micron features. The tungsten nucleation layer may be formed, for example, from a reaction of a tungsten-containing precursor such as, for example, tungsten hexafluoride ($WF_6$) with a reducing gas such as for example, silane ($SiH_4$), disilane ($Si_2H_6$), borane ($BH_3$), and diborane ($B_2H_6$), among others. In one embodiment, tungsten hexafluoride is reacted with silane. Helium and argon, or other inert gases, may also be provided along with the reactant gases either singly or in combination.

Typically, the reaction may be performed at a tungsten hexafluoride flow rate of about 5 sccm (standard cubic centimeters per minute) to about 100 sccm and a silane flow rate of about 1 sccm to about 100 sccm. The tungsten-containing precursor and the reducing gas may be provided to the process chamber in a tungsten-containing precursor to reducing gas ratio of about 1:1 to about 5:1. It is believed that such ratios for the tungsten-containing precursor and the reducing provide good step coverage for the tungsten nucleation layer. A total pressure of about 0.5 Torr to about 100 Torr and a pedestal temperature of about 200° C. to about 600° C. may be used.

The tungsten-containing precursor and the reducing gas may be flowed or pulsed into the process chamber for a time period of about 0.1 seconds to about 10 seconds, and preferably for about 1 second to about 3 seconds. The time period of reactant gas flow should be generally long enough to provide a sufficiently high deposition rate for the tungsten nucleation layer.

Referring to step 206, after the flow or pulse of the reactant gases has ceased, the process chamber is purged/pumped to remove reaction by-products generated during nucleation layer deposition. The production of these reaction by-products at or near the surface of the tungsten nucleation layer is believed to form a rough tungsten surface and contributes to non-conformality and poor step coverage during tungsten nucleation layer deposition. Removal of the reaction by-products using a purge/pump step may provide nucleation layers with improved step coverage.

The purge gas may be one or more gases selected from the group of argon, nitrogen ($N_2$), helium, neon, and xenon, among others. Typically, the process chamber is purged by providing thereto a purge gas at a flow rate of about 5 sccm to about 5000 sccm, for up to about 10 seconds.

Alternatively or in addition to introducing the purge gas, the process chamber may be depressurized in order to remove the residual reactant gases as well as any reaction by-products. The depressurization of the process chamber may result in the chamber pressure being reduced to a pressure in a range of about 0.01 Torr to about 40 Torr within a time period of about 0.5 seconds to about 20 seconds.

Depending upon the ratio of the tungsten-containing precursor to the reducing gas in the reactant gas mixture, as well as the removal time, excess tungsten-containing precursor may remain in the process chamber after the purge/pump step 206. Referring to step 208, after the purge/pump step is performed, a flow of the reducing gas may be provided to the process chamber. The flow of the reducing gas functions to react with excess tungsten-containing precursor that may be present near the surface of the nucleation layer, particularly in regions adjacent to the high aspect ration features after the purge/pump step 208.

The reducing gas may be provided to the process chamber as a pulse or flow for a time period within a range of about 0.1 seconds to about 10 seconds. In general, the time period should be long enough for the reducing gas to react with excess tungsten-containing precursor in the process chamber. Particularly for high aspect ratio features, it is believed that such flow of reducing gas may react with any excess tungsten-containing precursor in the vicinity of the feature improving the step coverage therefore and depositing tungsten in a void-free manner within such features.

Referring to step 210, after the flow or pulse of the reducing gas has ceased, the process chamber is purged/pumped to remove reaction by-products as well as residual gases remaining therein. The purge gas may be one or more gases selected from the group of argon, nitrogen, helium, neon, and xenon, among others. Typically, the process chamber is purged by providing thereto a purge gas at a flow rate of about 5 sccm to about 5000 sccm, for up to about 10 seconds.

Alternatively or in addition to introducing the purge gas, the process chamber may be depressurized in order to remove the residual reactant gases as well as any reaction by-products. The depressurization of the process chamber may result in the chamber pressure being reduced to a pressure in a range of about 0.01 Torr to about 40 Torr within a time period of about 0.5 seconds to about 20 seconds.

Referring to step 212, after purge/pump step 210, a total thickness of the tungsten nucleation layer will be formed on the substrate. Depending on specific device requirements, steps 204 through 210 may be repeated until a desired thickness for the tungsten nucleation layer is achieved. Thereafter, when the desired thickness for the tungsten nucleation layer is achieved the process is stopped as indicated by step 214.

The determination of the thickness of the tungsten nucleation layer may be performed using conventional processes such as, for example, spectroscopic measurements. Alternatively, the thickness of the nucleation layer may be estimated by performing a calculation based upon the deposition rate as determined using, for example, various process variables such as flow rates, temperature and pressure.

While steps 206 through 210 are depicted as three distinct steps in FIG. 2, steps 206 through 210 may take place simultaneously. For example, a purge gas may be provided to the process chamber simultaneously with the reducing gas to improve overall process throughput.

Additionally, process variables, such the temperature, pressure, gas flow rates, flow/pulse times, and the like, may be adjusted throughout the nucleation layer deposition process in order to optimize layer deposition rate. For example, early in the deposition process, a low ratio for the tungsten-containing precursor and reducing gas (e.g., ratio of about 1:1) may be used in step 204 in order to, for example, minimize the adverse effects of fluorine on underlying material layers. In subsequent deposition cycles, the ratio for the tungsten-containing precursor and reducing gas may be increased (e.g., ratio of 3:1).

Figure 3A:
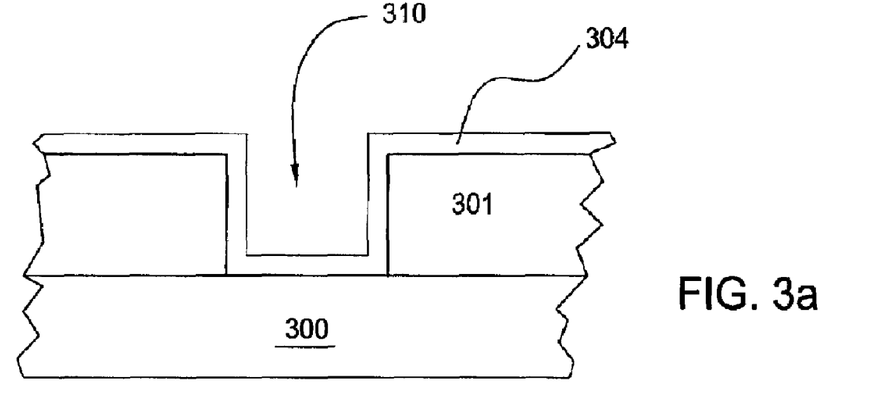
FIGS. 3A-3B depict cross-sectional views of a substrate at different stages of an integrated circuit fabrication sequence.
Figure 3B:
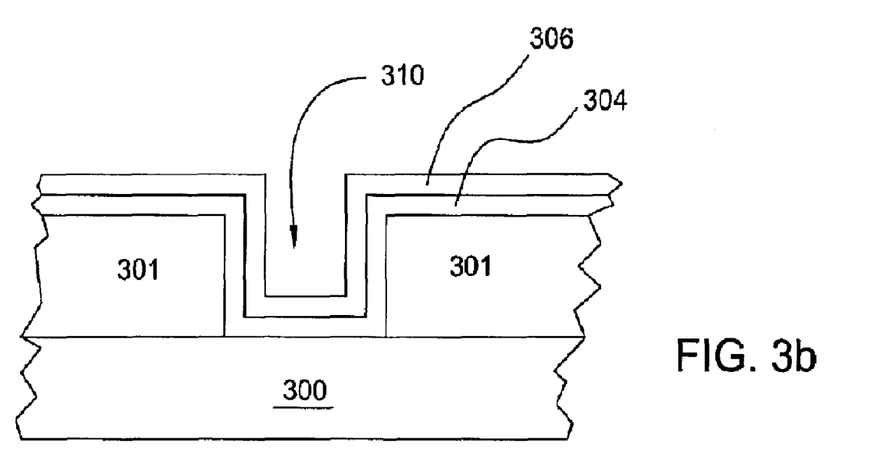

In an exemplary tungsten nucleation layer deposition process, a silicon substrate 300 having a feature 310 formed in a dielectric layer 301 was provided, as shown in FIG. 3A. The substrate 300 had a titanium nitride barrier layer 304 conformably deposited on the feature 310. A tungsten nucleation layer 306 was formed on the titanium nitride barrier layer within the feature 310, as shown in FIG. 3B. The tungsten nucleation layer was formed as described above with reference to FIG. 2.

Specifically, a gas mixture comprising tungsten hexafluoride and silane was provided to the process chamber for a time period of about 1.5 seconds. The respective flow rates of the tungsten hexafluoride and silane were about 30 sccm and about 10 sccm, respectively. An argon carrier gas was provided to the chamber at a flow rate of about 1,500 sccm along with tungsten hexafluoride. A nitrogen ($N_2$) carrier gas was provided to the chamber at a flow rate of about 300 sccm along with the silane.

The gas mixture was removed from the process chamber by providing a pulse of argon for a duration of about 2 seconds. Thereafter, a flow of silane gas was provided to the chamber at a flow rate of about 20 sccm for about 1 second. A pulse of argon was then provided for about 2 seconds in order purge the process chamber. This process sequence was repeated by providing the gas mixture, the argon purge, the flow of silane, and the argon purge until a thickness of about 250 Å for the tungsten nucleation layer was achieved. The resulting tungsten nucleation layer had a step coverage, as determined by transmission electron microscopy (TEM) of about 100%.

While the foregoing is directed to embodiments of the invention, other and further embodiments of the invention may be devised without departing from the basic scope thereof, and the scope thereof is determined by the claims that follow.

The invention claimed is:

1. A method for depositing a tungsten material on a substrate within a process chamber, comprising:

exposing a substrate within a process chamber simultaneously to a tungsten precursor and a reducing gas to deposit a tungsten nucleation layer on the substrate during a tungsten deposition process;

removing reaction by-products generated during the tungsten deposition process from the process chamber;

exposing the substrate to the reducing gas to react with residual tungsten precursor within the process chamber during a soak process;

removing reaction by-products generated during the soak process from the process chamber; and repeating the tungsten deposition process and the soak process during a cyclic deposition process.

2. The method of claim 1, wherein the reducing gas comprises a reducing agent selected from the group consisting of silane, disilane, borane, diborane, derivatives thereof, and combinations thereof.

3. The method of claim 2, wherein the tungsten precursor comprises tungsten hexafluoride.

4. The method of claim 3, wherein the cyclic deposition process is repeated until the tungsten nucleation layer has a thickness of about 500 Å.

5. The method of claim 3, wherein the tungsten nucleation layer is deposited on a barrier layer comprising titanium nitride.

6. The method of claim 1, wherein the tungsten deposition process lasts for a time period within a range from about 0.1 seconds to about 10 seconds.

7. The method of claim 6, wherein the time period lasts about 3 seconds or less.

8. The method of claim 7, wherein the time period lasts about 1 second or less.

9. The method of claim 1, wherein the soak process lasts for a time period of up to about 10 seconds.

10. The method of claim 9, wherein the reducing gas comprises diborane.

11. The method of claim 9, wherein the reducing gas comprises silane.

12. The method of claim 1, wherein the removing reaction by-products generated during the tungsten deposition process overlaps in time with the soak process.

13. A method for depositing a tungsten material on a substrate within a process chamber, comprising:
    exposing a substrate within a process chamber simultaneously to a tungsten precursor and a reducing gas to deposit a tungsten nucleation layer on the substrate during a tungsten deposition process, wherein the reducing gas comprises diborane;
    removing reaction by-products generated during the tungsten deposition process from the process chamber;
    exposing the substrate to the reducing gas to react with residual tungsten precursor within the process chamber during a soak process;
    removing reaction by-products generated during the soak process from the process chamber; and
    repeating the tungsten deposition process and the soak process during a cyclic deposition process.

14. The method of claim 13, wherein the tungsten precursor comprises tungsten hexafluoride.

15. The method of claim 14, wherein the cyclic deposition process is repeated until the tungsten nucleation layer has a thickness of about 500 Å.

16. The method of claim 14, wherein the tungsten nucleation layer is deposited on a barrier layer comprising titanium nitride.

17. The method of claim 13, wherein the tungsten deposition process lasts for a time period within a range from about 0.1 seconds to about 10 seconds.

18. The method of claim 17, wherein the time period lasts about 3 seconds or less.

19. The method of claim 18, wherein the time period lasts about 1 second or less.

20. The method of claim 13, wherein the soak process lasts for a time period of up to about 10 seconds.

21. The method of claim 13, wherein the removing reaction by-products generated during the tungsten deposition process overlaps in time with the soak process.

22. A method for depositing a tungsten material on a substrate within a process chamber, comprising:
    exposing a substrate within a process chamber simultaneously to a tungsten precursor and a reducing gas to deposit a tungsten nucleation layer on the substrate during a tungsten deposition process, wherein the reducing gas comprises silane;
    removing reaction by-products generated during the tungsten deposition process from the process chamber;
    exposing the substrate to the reducing gas to react with residual tungsten precursor within the process chamber during a soak process;
    removing reaction by-products generated during the soak process from the process chamber; and
    repeating the tungsten deposition process and the soak process during a cyclic deposition process.

23. The method of claim 22, wherein the tungsten precursor comprises tungsten hexafluoride.

24. The method of claim 23, wherein the cyclic deposition process is repeated until the tungsten nucleation layer has a thickness of about 500 Å.

25. The method of claim 23, wherein the tungsten nucleation layer is deposited on a barrier layer comprising titanium nitride.

26. The method of claim 22, wherein the tungsten deposition process lasts for a time period within a range from about 0.1 seconds to about 10 seconds.

27. The method of claim 26, wherein the time period lasts about 3 seconds or less.

28. The method of claim 27, wherein the time period lasts about 1 second or less.

29. The method of claim 22, wherein the soak process lasts for a time period of up to about 10 seconds.

30. The method of claim 22, wherein the removing reaction by-products generated during the tungsten deposition process overlaps in time with the soak process.

* * * * *

UNITED STATES PATENT AND TRADEMARK OFFICE
CERTIFICATE OF CORRECTION

PATENT NO. : 7,695,563 B2  
APPLICATION NO. : 11/621040  
DATED : April 13, 2010  
INVENTOR(S) : Lu et al.

Page 1 of 1

It is certified that error appears in the above-identified patent and that said Letters Patent is hereby corrected as shown below:

On the Title Page item [56]:

Please delete "4,859,307 A 8/1989 Nishizawa et al." and insert
-- 4,859,625 A 8/1989 Matsumoto -- therefor.

Signed and Sealed this
Sixth Day of August, 2013

Teresa Stanek Rea
*Acting Director of the United States Patent and Trademark Office*